United States Patent
Tseng et al.

(10) Patent No.: US 11,475,953 B1
(45) Date of Patent: Oct. 18, 2022

(54) SEMICONDUCTOR LAYOUT PATTERN AND FORMING METHOD THEREOF

(71) Applicant: UNITED MICROELECTRONICS CORP., Hsin-Chu (TW)

(72) Inventors: Chun-Yen Tseng, Tainan (TW); Yu-Tse Kuo, Tainan (TW); Shu-Ru Wang, Taichung (TW); Chun-Hsien Huang, Tainan (TW); Hsin-Chih Yu, Hsinchu County (TW); Meng-Ping Chuang, Hsinchu (TW); Li-Ping Huang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/377,396

(22) Filed: Jul. 16, 2021

(30) Foreign Application Priority Data

Jun. 23, 2021 (CN) .......................... 202110696593.X

(51) Int. Cl.
G11C 15/00 (2006.01)
G11C 15/04 (2006.01)
H01L 27/02 (2006.01)

(52) U.S. Cl.
CPC .......... *G11C 15/04* (2013.01); *H01L 27/0207* (2013.01)

(58) Field of Classification Search
CPC ........................... G11C 15/04; H01L 27/0207
USPC .......................................................... 365/49
See application file for complete search history.

(56) References Cited

U.S. PATENT DOCUMENTS

| | | | |
|---|---|---|---|
| 6,563,727 B1 * | 5/2003 | Roth ...................... | G11C 15/00 365/206 |
| 7,042,747 B1 * | 5/2006 | Castagnetti ............ | G11C 15/04 365/189.07 |
| 7,112,831 B2 * | 9/2006 | Kim ..................... | H01L 27/1052 257/E27.099 |
| 7,126,837 B1 * | 10/2006 | Banachowicz ...... | G11C 15/046 257/E27.099 |
| 7,259,979 B2 * | 8/2007 | Sachan ............... | H01L 27/1116 365/72 |
| 7,304,874 B2 * | 12/2007 | Venkatraman ...... | H01L 27/1104 365/49.1 |
| 7,355,873 B2 * | 4/2008 | Nii ........................ | G11C 15/04 365/49.1 |
| 7,450,409 B1 * | 11/2008 | Maheshwari .......... | G11C 15/04 365/49.1 |
| 7,944,724 B2 * | 5/2011 | Chu ....................... | G11C 15/04 365/49.1 |
| 8,355,269 B1 * | 1/2013 | Zampaglione ......... | G11C 15/04 365/49.16 |
| 9,502,112 B2 * | 11/2016 | Nii ........................ | G11C 15/04 |
| 10,541,028 B2 * | 1/2020 | Yabuuchi .............. | H01L 23/528 |
| 10,892,013 B2 * | 1/2021 | Huang ................ | H01L 27/1116 |

OTHER PUBLICATIONS

Pagiamtzis ,IEEE:Content-Addressable Memory (CAM) Circuits and Architectures: A Tutorial and Survey ,2006.

* cited by examiner

*Primary Examiner* — Viet Q Nguyen
(74) *Attorney, Agent, or Firm* — Winston Hsu

(57) ABSTRACT

The invention provides a semiconductor layout pattern, the semiconductor layout pattern includes a substrate, a plurality of ternary content addressable memories (TCAM) are arranged on the substrate, the layout of at least two TCAM is mirror symmetric with each other along an axis of symmetry, and the two TCAM are connected to the same search line (SL) together.

10 Claims, 5 Drawing Sheets

SEMICONDUCTOR LAYOUT PATTERN AND FORMING METHOD THEREOF

BACKGROUND OF THE INVENTION

1. Field of the Invention

The present invention relates to a semiconductor layout pattern and its forming method, in particular to a layout pattern including ternary content addressable memory (TCAM), which achieves the effects of reducing process steps and process difficulty by sharing a part of metal wires of search lines.

2. Description of the Prior Art

When performing digital data operations, the large amount of data needs to be processed. The stored data of some applications (such as network routers) needs to be updated dynamically, and the stored data cannot be sorted in advance. It is difficult to achieve instant data query. In order to effectively speed up searching large random data, content addressable memory (CAM) is adopted to solve various searching problems. Content addressable memory is like a huge lookup table. It can find the address of the matching keyword based on the input keyword. The architecture of CAM allows the keyword to be searched to be compared with the data stored in the CAM at the same time, and outputs the data address that matches the input keyword, so that the keyword address found by the CAM can be used to find keyword associated information.

In a binary CAM, each bit has two states, 0 or 1, and each bit in a ternary CAM (TCAM) has three states, in addition to 0 and 1, a don't care state, so called ternary, is the third state feature of TCAM that enables both exact match lookups and fuzzy match lookups.

SUMMARY OF THE INVENTION

The invention provides a semiconductor layout pattern, which comprises a substrate, wherein a plurality of ternary content addressable memories (TCAM) are arranged on the substrate, wherein the layout of at least two TCAM is mirror symmetric with each other along an axis of symmetry, and the two TCAM are connected to the same search line (SL) together.

In addition, the present invention provides a manufacturing method of semiconductor layout pattern, which includes providing a substrate on which a plurality of ternary content addressable memories (TCAMs) are formed, wherein the layout of at least two TCAMs is mirror symmetric with each other along an axis of symmetry, and the two TCAMs are connected to the same search line (SL).

The feature of the invention is that adjacent TCAM can share a part of metal wires, so the manufacture of metal wires can be omitted. In this way, more area can be left in the TCAM space to adjust the layout of other metal layout layers, thus achieving the effect of simplifying layout patterns and manufacturing processes.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
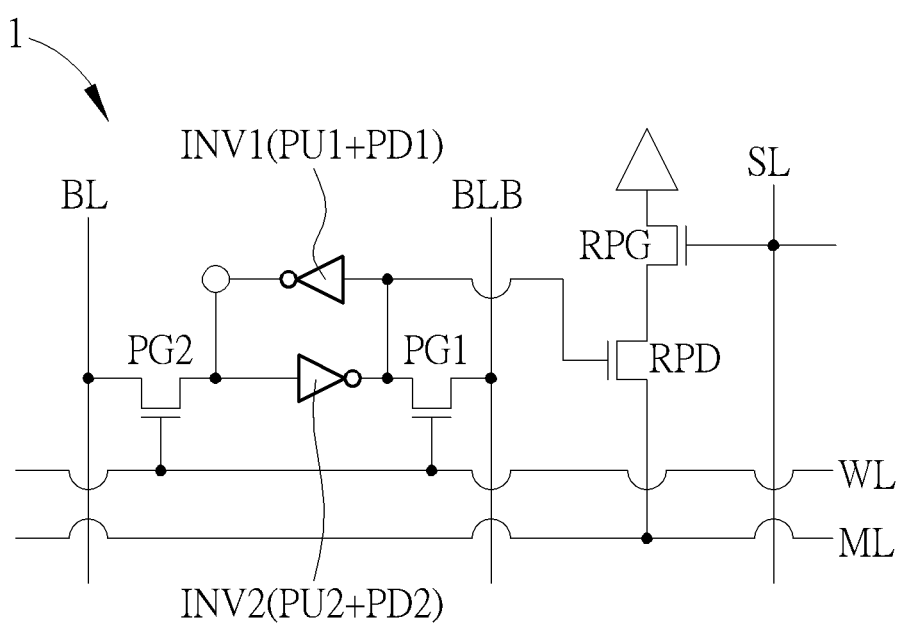
FIG. 1 shows a circuit diagram of an eight-transistor layout pattern.

In this embodiment, firstly, an eight-transistor layout pattern 1 is disclosed, the eight-transistor layout pattern 1 is the smallest cell assembled into a ternary content addressable memory (TCAM) in the subsequent steps. As shown in FIG. 1, the eight-transistor layout pattern 1 consists of a first pull-up transistor PU1, a second pull-up transistor PU2, a first pull-down transistor PD1, a second pull-down transistor PD2, a first pass gate transistor PG1, a second access transistor PG2, and two read transistors RPG and RPG connected in series with each other The first pull-up transistor PU1 and the first pull-down transistor PD1 constitute a first inverter INV1, the second pull-up transistor PU2 and the second pull-down transistor PD2 constitute a second inverter INV2, and the first inverter INV1 and the second inverter INV2 constitute a latch circuit, so that data can be latched at a storage node. In addition, in this embodiment, a source region of each of the first pull-up transistor PU1 and the second pull-up transistor PU2 is electrically connected to a voltage source (e.g., Vcc, not shown), and a drain region of each of the first pull-down transistor PD1 and the second pull-down transistor PD2 is electrically connected to a voltage source (e.g., Vss, not shown).

The gates of the first access transistor PG1 and the gate of the second access transistor PG2 are coupled to a word line (WL), and the source of the first access transistor PG1 and the source of the second access transistor PG2 are coupled to corresponding bit lines BLB and BL, respectively. In addition, the gate of the read transistor RPG is connected to a search line (SL), the drain of the read transistor RPG is connected to a voltage source (such as Vss), the gate of the read transistor RPD is connected to a latch circuit, and the source of the read transistor RPD is connected to a match line (ML).

Figure 2:
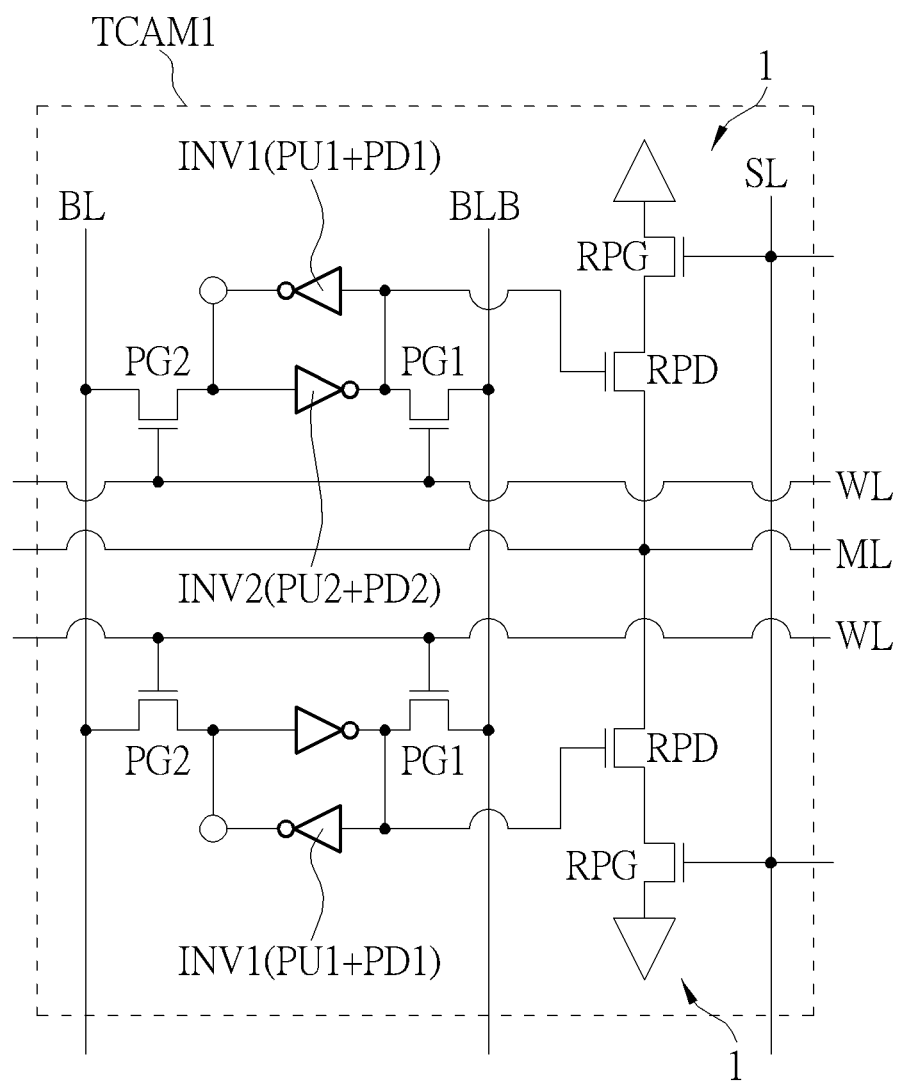
FIG. 2 shows a schematic circuit diagram of a ternary content addressable memory (TCAM).

As shown in FIG. 2, two eight-transistor layout patterns 1 are arranged to form a ternary content addressable memory (TCAM). FIG. 2 shows a circuit diagram of a ternary content addressable memory (TCAM) cell. As shown in FIG. 2, the ternary content addressable memory TCAM1 of the present invention includes two symmetrical eight-transistor layout patterns 1. The working principle and characteristics of ternary content addressable memory belong to the conventional technology in the field, so they are not described in detail here.

The ternary content addressable memory TCAM can be repeatedly arranged to form a larger memory. However, the applicant found that if a plurality of ternary content addressable memories TCAM are only repeatedly arranged, the space utilization rate of memory devices still needs to be improved. The reason is that there is no shared component between adjacent TCAM, so all necessary components must be formed in each TCAM, which is not conducive to reducing the total memory area.

Figure 3:
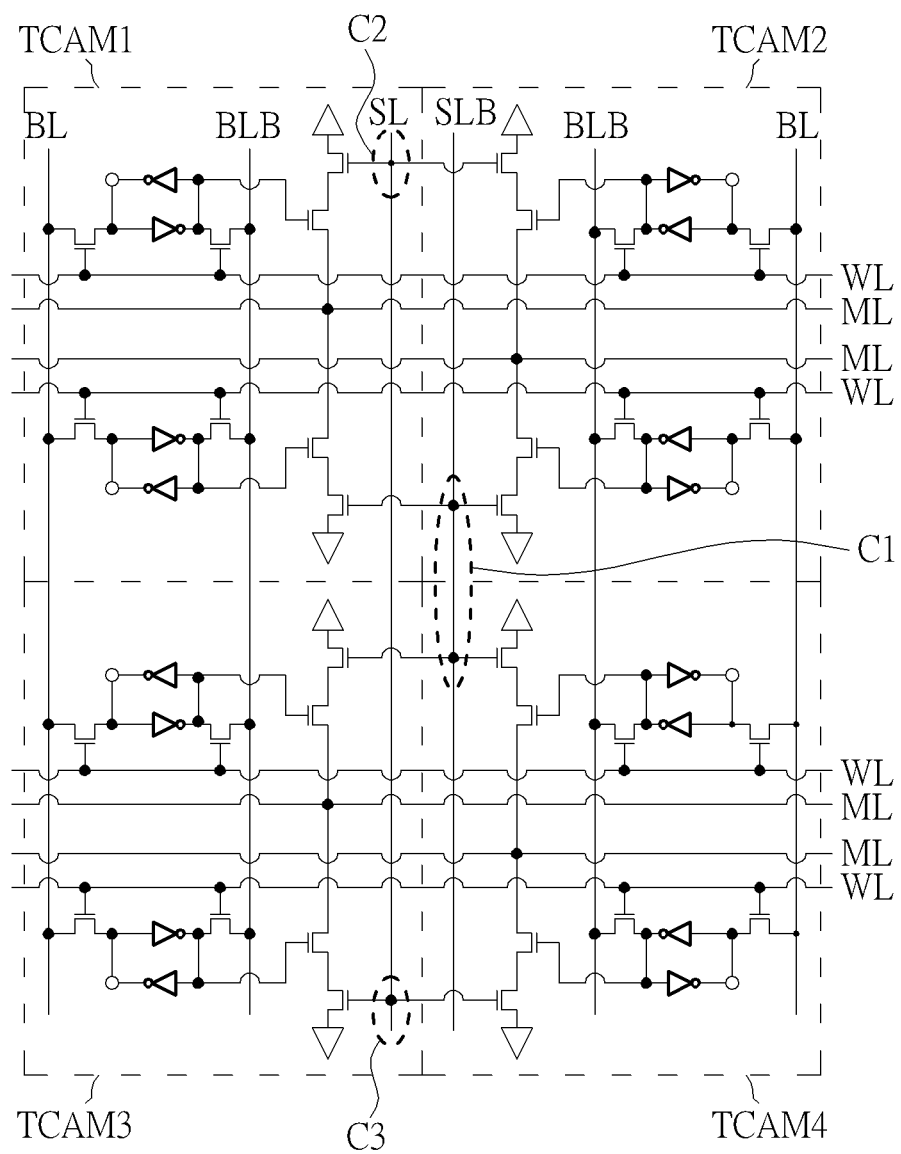
FIG. 3 shows a circuit diagram composed of four ternary content addressable memories (TCAMs).

The feature of the present invention is that by adjusting the layout pattern, the adjacent TCAM can share the same search line (SL), so that the space originally required to form two search lines only needs one shared search line, and a part of surplus space can be used by other components, or the total area of memory can be reduced. Details are described in the following paragraphs:

As shown in FIG. 3, FIG. 3 shows a circuit diagram composed of four ternary content addressable memories (TCAMs). The TCAM shown in FIG. 2 is combined with each other to form a larger memory circuit pattern. In which the circuit pattern of FIG. 3 includes ternary content addressable memories TCAM1, TCAM2, TCAM3 and TCAM4. In which each ternary content addressable memory TCAM1-TCAM4 has a structure similar to the TCAM1 shown in FIG. 2. It is worth noting that in this embodiment, TCAM is arranged in a mirror way, in other words, TCAM1 and TCAM4 are arranged in an up-and-down mirror manner (symmetrical along the central horizontal axis), and TCAM2 and TCAM3 are also arranged in an up-and-down mirror manner (symmetrical along the central horizontal axis). In this way, adjacent TCAMs can share the same search line. For example, TCAM2 and TCAM3 in FIG. 3 share the search line SLB (such as at node C1). In the same way, TCAM1 and another adjacent TCAM (not shown) above will be connected to search line SL (such as at node C2), TCAM3 and another adjacent TCAM (not shown) below will be connected to search line SL (such as at node C3). The adjacent TCAM shares the search line, which can simplify the formation steps of subsequent layout patterns and reduce the total area of memory cells.

Figure 4:
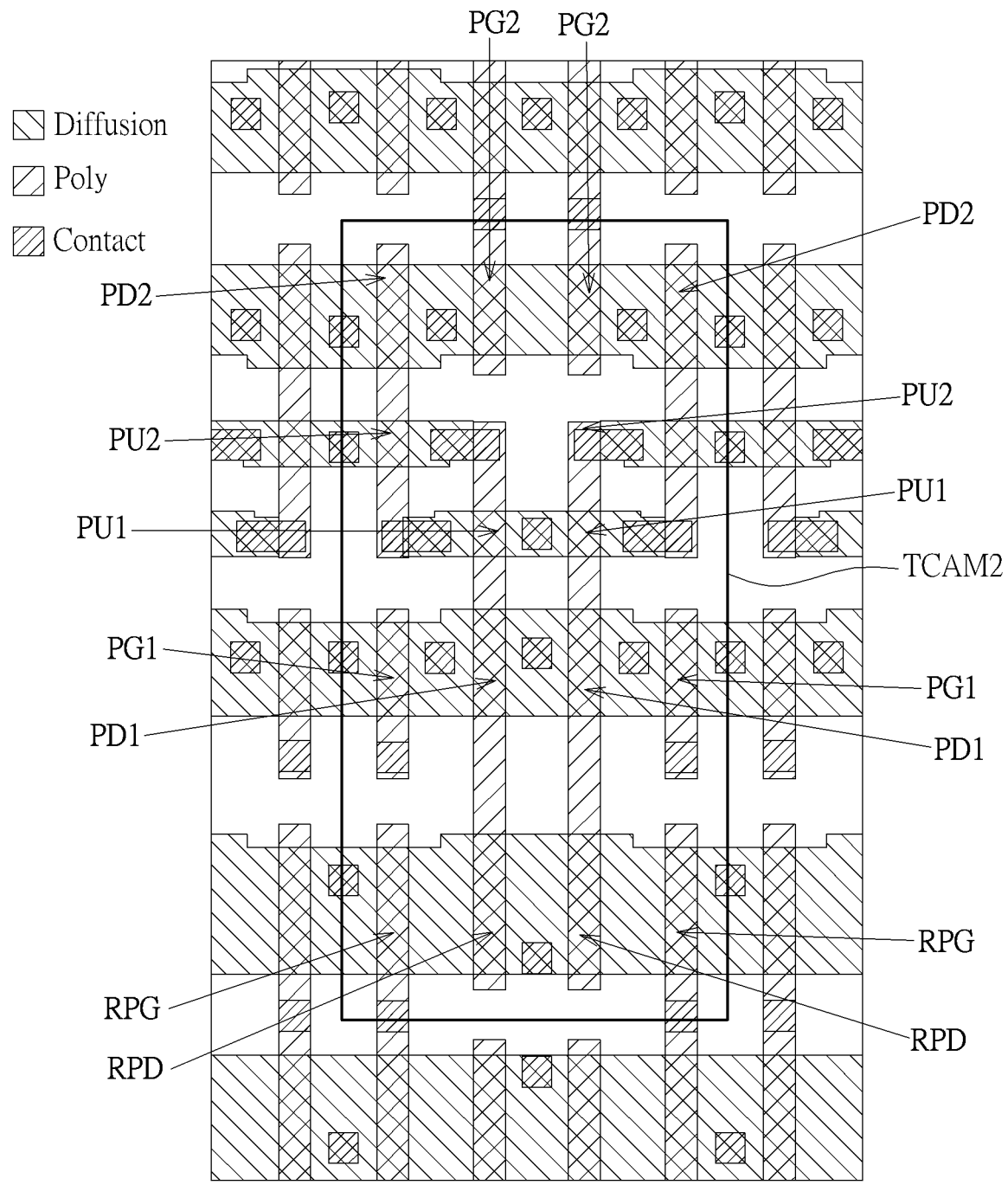
FIG. 4 FIG. 5 show the layout of a ternary content addressable memory (TCAM) according to the present invention.
Figure 5:
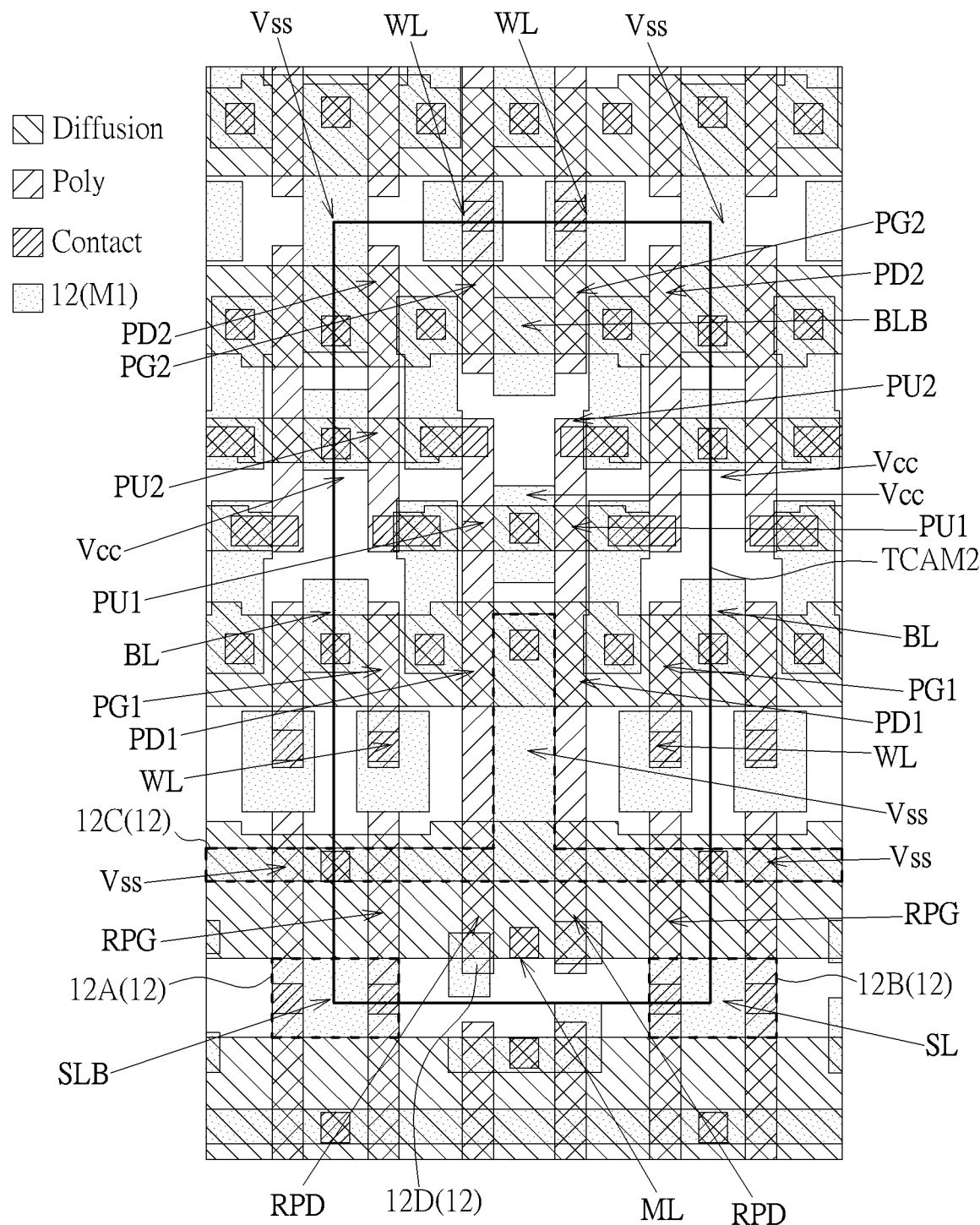

FIG. 4 FIG. 5 show the layout of a ternary content addressable memory (TCAM) according to the present invention. As shown in FIG. 4, in order to form TCAM, a plurality of diffusion regions, a plurality of gate structures (for example, polysilicon gates, abbreviated as poly) and a plurality of contact structures are formed on the substrate 10. In addition, the diffusion region can also be replaced by fin structure, and the diffusion region will still be taken as an example. The gate structure (poly) spans the diffusion region and is combined into the above-mentioned transistors, including a first pull-up transistor PU1, a second pull-up transistor PU2, a first pull-down transistor PD1, a second pull-down transistor PD2, a first access transistor PG1, a second access transistor PG2, and a read transistor RPG and a read transistor RPD. And each transistor can be electrically connected to each signal source, such as bit line BL, word line WL, search line SL, match line ML, voltage source Vcc, voltage source Vss, etc., through a subsequently formed metal wire or contact structure. For the sake of clear description of the drawings, the names of the transistors or the connected signal sources are directly marked on the corresponding positions in the layout drawings in FIG. 4 and FIG. 5 to indicate that a specific transistor is formed at the position or that the position is connected to a specific signal source.

In FIG. 4, the ternary content addressable memory TCAM2 described in FIG. 3 is taken as an example. TCAM2 includes the following two transistors: first pull-up transistor PU1, second pull-up transistor PU2, first pull-down transistor PD1, second pull-down transistor PD2, first access transistor PG1, second access transistor PG2, and read transistor RPG and read transistor RPD. In which the position of each transistor has been marked in FIG. 4.

Then, as shown in FIG. 5, a plurality of metal wires 12 are formed to cover each transistor. Since the metal wires 12 belong to the first metal layer above the transistor, they are often referred to as the first metal layer (M1) in the field of semiconductor manufacturing. The metal wire 12 can electrically connect each transistor to each signal source by cooperating with the contact structure and the subsequently formed vertical interconnection via. In FIG. 5, the signal sources connected at different positions have been marked.

It is worth noting that the metal wire 12 in TCAM2 in FIG. 5 includes metal wire 12A and metal wire 12B, which are illustrated as metal wire 12A. The metal wire 12A is the conductive part of TCAM2 connected to the search line SLB. The metal wire 12A is located at the boundary area of TCAM2, for example, at the left boundary of TCAM2 in this embodiment. the metal wire 12A will be shared with another adjacent TCAM, that is, another adjacent TCAM (for example, at the left side of TCAM2). Similarly, the metal wire 12B on the right side of TCAM2 is connected to the search line SL and shared with another adjacent TCAM. In other words, another adjacent TCAM (for example, located on the right side of TCAM2) is also connected to the search line SL through the metal wire 12A.

The above adjacent TCAM can share a part of metal wires. In this way, more area can be left in the TCAM space to adjust the layout of other layout layers, thus achieving the effect of simplifying layout patterns and processes.

Please refer to FIG. 5 again, because the adjacent TCAM share some metal wires (e.g., metal wires 12A and 12B), leaving extra space, other metal layout patterns can be adjusted accordingly, which may achieve the purpose of saving steps. For example, the metal wire 12C in FIG. 5 has an inverted T-shaped pattern, which is simultaneously connected to the lower first pull-down transistor PD1 and the reading transistor RPG More specifically, the drain of the first pull-down transistor PD1 and the drain of the read transistor RPG are both connected to the voltage source Vss. However, in the original layout pattern (that is, before layout pattern adjustment), it is necessary to form two separate metal wires to electrically connect the first pull-down transistor PD1 and the read transistor RPG respectively, and then connect the two separate metal wires together in other subsequent metal layers. In this embodiment, since the adjacent TCAM shares a part of the metal wires, there is an extra space, so the two separated metal wires can be connected together at the first metal layer M1, that is, the metal wire 12C shown in FIG. 5 is formed. In this way, subsequent steps can be saved.

In addition, in this embodiment, the metal wire 12D is electrically connected to the match line ML. since the metal wire 12C is designed in an inverted T-shape to connect the first pull-down transistor PD1 and the read transistor RPG at the same time, the metal wire 12D does not overlap with the metal wire 12C in the lateral direction.

According to the above description and drawings, the present invention provides a semiconductor layout pattern, which comprises a substrate 10 with a plurality of ternary content addressable memories (TCAMs), wherein the layout of at least two TCAMs is mirror symmetric with each other along an axis of symmetry (e.g., the transverse central axis of FIG. 3), and the two TCAMs are connected to the same search line SL.

In some embodiments of the present invention, each TCAM includes two symmetrical eight-transistor layout patterns 1, and each eight-transistor layout pattern 1 includes a first pull-up transistor (PU1) and a first pull-down transistor (PD1) to form a first inverter (INV1), and a second pull-up transistor (PU2) and a second pull-down transistor (PD2) to form a second inverter (INV2) A first access transistor (PG1) and a second access transistor (PG2) are connected with the first inverter and the second inverter, and a read transistor (RPD) and a read transistor (RPG) are connected in series with each other, wherein the gate structure of the read transistor (RPD) is connected with the gate structure of the first pull-down transistor (PD1).

In some embodiments of the present invention, a source of the read transistor RPD is connected to a match line ML.

In some embodiments of the present invention, a gate of the read transistor RPG is connected to the search line SL.

In some embodiments of the present invention, a drain of the read transistor RPG is connected to a voltage source Vss.

In some embodiments of the present invention, the layout pattern includes a first metal layer M1(12) including a plurality of metal wires, and a first metal wire 12C included in the first metal layer M1 is connected to the voltage source Vss, and the first metal wire is connected to the drain of the read transistor RPG and a drain of the first pull-down transistor PD1 at the same time.

In some embodiments of the present invention, the first metal layer M1 includes a second metal wire 12A located on the symmetry axis between two TCAM's, and the second metal wire 12A is connected to the search line SL, and at least includes one TCAM and another TCAM adjacent and symmetrical to it share the same second metal wire 12A.

In some embodiments of the present invention, a third metal wire 12D included in the first metal layer M1 is connected to a match line ML, and the third metal wire 12D is not aligned with the first metal wire in a horizontal direction.

In addition, the present invention provides a manufacturing method of semiconductor layout pattern, which includes providing a substrate 10 on which a plurality of ternary content addressable memories TCAM are formed, wherein the layout of at least two TCAM are mirror symmetric with each other along an axis of symmetry (for example, the transverse central axis of FIG. 3), and the two TCAM are connected to the same search line SL together.

To sum up, the present invention is characterized in that the adjacent TCAM can share a part of metal wires, so the manufacture of metal wires can be omitted. In this way, more area can be left in the TCAM space to adjust the layout of other metal layout layers, thus achieving the effect of simplifying layout patterns and manufacturing processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout pattern, comprising:
   a substrate having a plurality of ternary content addressable memories (TCAMs), wherein the layout of at least two TCAMs is mirror symmetric to each other along an axis of symmetry, and the two TCAMs are connected to a same search line (SL);
   wherein each TCAM comprises two mutually symmetrical eight-transistor layout patterns, and each eight-transistor layout pattern comprises:
   a first pull-up transistor (PU1) and a first pull-down transistor (PD1) constitute a first inverter (INV1)
   a second pull-up transistor (PU2) and a second pull-down transistor (PD2) constitute a second inverter (inv2);
   a first access transistor (PG1) and a second access transistor (PG2) connected to the first inverter and the second inverter; and
   a read transistor (RPD) and another read transistor (RPG) connected in series with each other, wherein a gate structure of the read transistor (RPD) is connected with a gate structure of the first pull-down transistor (PD1), wherein a drain of the read transistor (RPG) is connected to a voltage source (Vss);
   wherein the layout pattern comprises a first metal layer (M1) including a plurality of metal wires, and a first metal wire included in the first metal layer (M1) is connected to the voltage source (Vss), and the first metal wire is connected to the drain of the read transistor (RPG) and a drain of the first pull-down transistor (PD1) simultaneously, and the first metal wire has an inverted T-shaped pattern.

2. The semiconductor layout pattern according to claim 1, wherein a source of the read transistor (RPD) is connected to a match line (ML).

3. The semiconductor layout pattern according to claim 1, wherein a gate of the read transistor (RPG) is connected to the search line (SL).

4. The semiconductor layout pattern according to claim 1, wherein a second metal wire included in the first metal layer (M1) is located on the symmetry axis between the two TCAMs, and the second metal wire is connected to the search line (SL), and the at least one TCAM and another TCAM adjacent and symmetrical to it share the same second metal wire.

5. The semiconductor layout pattern according to claim 1, wherein a third metal wire included in the first metal layer (M1) is connected to a match line (ML), and the third metal wire is not aligned with the first metal wire in a horizontal direction.

6. A method for manufacturing a semiconductor layout pattern, comprising:
   providing a substrate, on which a plurality of ternary content addressable memories (TCAMs) are formed, wherein the layout of at least two TCAMs is mirror symmetric with each other along an axis of symmetry, and the two TCAMs are connected to a same search line (SL);
   wherein each TCAM comprises two mutually symmetrical eight-transistor layout patterns, and each eight-transistor layout pattern comprises:
   a first pull-up transistor (PU1) and a first pull-down transistor (PD1) constitute a first inverter (INV1)
   a second pull-up transistor (PU2) and a second pull-down transistor (PD2) constitute a second inverter (inv2);
   a first access transistor (PG1) and a second access transistor (PG2) connected to the first inverter and the second inverter; and
   a read transistor (RPD) and another read transistor (RPG) connected in series with each other, wherein a gate structure of the read transistor (RPD) is connected with a gate structure of the first pull-down transistor (PD1), wherein a drain of the read transistor (RPG) is connected to a voltage source (Vss);

wherein the layout pattern comprises a first metal layer (M1) including a plurality of metal wires, and a first metal wire included in the first metal layer (M1) is connected to the voltage source (Vss), and the first metal wire is connected to the drain of the read transistor (RPG) and a drain of the first pull-down transistor (PD1) simultaneously, and the first metal wire has an inverted T-shaped pattern.

7. The method according to claim 6, wherein a source of the read transistor (RPD) is connected to a match line (ML).

8. The method according to claim 6, wherein a gate of the read transistor (RPG) is connected to the search line (SL).

9. The method according to claim 6, wherein a second metal wire included in the first metal layer (M1) is located on the symmetry axis between the two TCAMs, and the second metal wire is connected to the search line (SL), and the at least one TCAM and another TCAM adjacent and symmetrical to it share a same second metal wire.

10. The method according to claim 6, wherein a third metal wire included in the first metal layer (M1) is connected to a match line (ML), and the third metal wire is not aligned with the first metal wire in a horizontal direction.

* * * * *